United States Patent [19]

Dreps et al.

[11] Patent Number: 5,295,161
[45] Date of Patent: Mar. 15, 1994

[54] FIBER OPTIC AMPLIFIER WITH ACTIVE ELEMENTS FEEDBACK CIRCUIT

[75] Inventors: Daniel M. Dreps, Endicott; Raymond P. Rizzo, Vestal, both of N.Y.

[73] Assignee: International Business Machines Corporation, Armonk, N.Y.

[21] Appl. No.: 698,626

[22] Filed: May 10, 1991

[51] Int. Cl.⁵ .............................................. H04L 25/06
[52] U.S. Cl. ..................................... 375/76; 375/17; 330/259; 307/491
[58] Field of Search ................. 375/17, 19, 36, 76; 330/261, 265, 270, 311, 9, 259, 252, 59, 308, 260; 307/359, 491, 495

[56] References Cited

U.S. PATENT DOCUMENTS

| | | | |
|---|---|---|---|
| 3,419,809 | 12/1968 | Lach et al. | 330/83 |
| 3,688,205 | 8/1972 | Burper | 375/76 |
| 4,257,125 | 3/1981 | Theall, Jr. | 455/194 |
| 4,377,759 | 3/1983 | Ohhata et al. | 330/9 |
| 4,387,465 | 6/1983 | Becker | 375/76 |
| 4,580,103 | 4/1986 | Tompsett | 330/9 |
| 4,736,391 | 4/1988 | Siegel | 375/76 |
| 4,852,126 | 7/1989 | Tanaka et al. | 375/76 |
| 4,873,702 | 10/1989 | Chiu | 375/19 |
| 4,994,692 | 2/1991 | Wolke | 307/494 |
| 5,008,632 | 4/1991 | Sutterlin | 330/259 |
| 5,025,456 | 6/1991 | Ota et al. | 375/76 |
| 5,039,952 | 8/1991 | Dreps et al. | 330/261 |
| 5,047,727 | 9/1991 | Theus | 330/261 |
| 5,119,404 | 6/1992 | Aihara | 375/76 |
| 5,146,476 | 9/1992 | Whitehead et al. | 375/76 |

OTHER PUBLICATIONS

IBM TDB vol. 26 No. 7B Dec. 1983–"Offset Compensation for Balanced Signal Communication Zero-Crossing Threshold Detector".

*Primary Examiner*—Curtis Kuntz
*Assistant Examiner*—T. Ghebretinsae
*Attorney, Agent, or Firm*—William H. Steinberg

[57] ABSTRACT

A differential transimpedance amplifier used in amplifying optical signals transmitted with a balanced code has a level restore circuit which integrates the digital output of the amplifier and feeds back the result to one of the differential inputs of the amplifier. The feedback signal removes imbalances from the amplifier output. The balanced amplifier output can then be processed by a clock reconstruction circuit to accurately sample the received optical signal with a low bit error rate.

14 Claims, 3 Drawing Sheets

FIBER OPTIC AMPLIFIER WITH ACTIVE ELEMENTS FEEDBACK CIRCUIT

BACKGROUND OF THE INVENTION

The present invention relates to binary communication receivers and more particularly to an amplifier feedback circuit for removing amplifier offsets in fiber optic receivers processing balanced code.

Binary communication receivers typically operate with signals in the microvolt or millivolt range which must be amplified to logic levels. Typically, differential input devices are used. The input stage is not perfectly balanced and when multistage amplifiers are used each stage adds and amplifies the previous offsets. When a laser is used to generate optical signals, the laser characteristics can also contribute to the DC offset problem. The differences in input voltages needed to bring the output of the amplifier to zero is called the input offset voltage. Offsets occur due to manufacturing variations in the transistors used in the amplifier. The input offset voltage drifts with temperature and time. Any unbalance is amplified along with the input signal and cause the digitized output of the amplifier to distort the time period of the digitized signals.

High speed digital (gigabit system) fiber optic data systems use balanced coding schemes to simplify the data recovery circuitry. In a balanced coding scheme the average number of high and low bits are equal. In an optical system, where the signal from the amplifier is processed by a clock restoration arrangement which controls a latch, for example, to sample the digital output of the amplifier, the clock restoration circuit relies on the fact that the width of the high and low digital pulses will be equal. When the pulses are not of equal length the bit error rate in sampling the data increases, limiting the data transmission rates that can be achieved. A reduction in pulse width distortion would decrease the bit error rate. In systems where long distances between transmitters and receivers are desired, an increase in the bit error rate adversely affects data integrity. A sensitivity decrease of 10 dbm can result due to offset effects which can result in a distance penalty of approximately 20 kilometers in order to maintain a desired bit error rate.

It is an object of the present invention to provide a feedback circuit for an amplifier receiving balanced code which removes amplifier offsets which would degrade performance.

It is a further object of the present invention to provide a feedback circuit for an amplifier receiving balanced code which allows the best bit error rate achievable, to be obtained from the amplifier.

It is another object of the current invention to provide a feedback circuit which can be implemented on the same integrated circuitry as the amplifier.

It is a still further object of the present invention to provide a level restore circuit to balance amplifier offsets suitable for use with a high gain transimpedance amplifier.

SUMMARY OF THE INVENTION

In one aspect of the present invention a receiver for recovering multibit binary digital messages from transmitted balanced code is provided. The receiver comprises a differential amplifier for amplifying received balanced code and supplying a binary digital output. The receiver further comprises an active element level restore circuit coupled to the digital output and supplying a feedback signal to one of the differential amplifier inputs. The level restore circuit determines the pulse width difference of the high and low digital signals provided by the amplifier and integrates the pulse width difference signal. The integrated pulse width signal is supplied to one of the inputs of the differential amplifier, so that a balanced digital output from the amplifier is achieved.

DETAILED DESCRIPTION OF A PREFERRED EMBODIMENT

Figure 1:
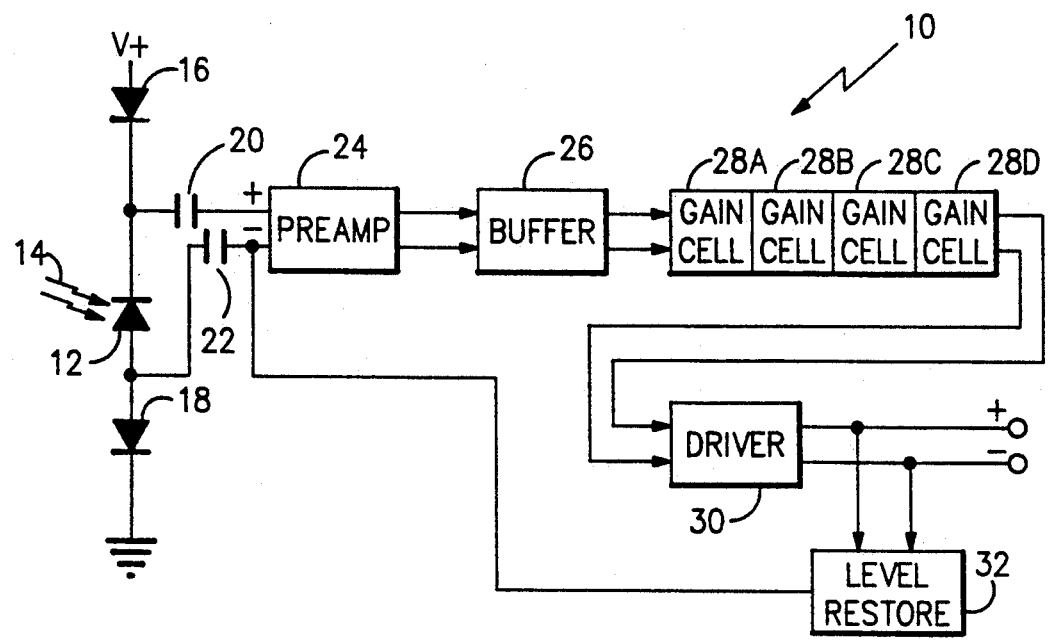
FIG. 1 is a block diagram of an optical communication receiver having an amplifier with single ended feedback.

Referring now to the drawing wherein like numerals indicate like elements throughout and particularly FIG. 1 thereof, a fiber optic receiver circuit is shown, generally designated as 10, which utilizes the present invention. Circuit 10 comprises a photosensitive PIN diode 12 at its input. When light 14 impinges upon the photosensitive diode it conducts. The photosensitive diode is biased by diodes 16 and 18 which provide a low thermal noise source because of their low series resistance. Alternatively, a resistor can be substituted for each of the diodes 16 and 18 to provide the bias. The voltage at the anode and the cathode of the photosensitive diode 12 are applied via AC coupling capacitors 20 and 22 to differential inputs of differential transimpedance (current to voltage) pre-amplifier 24. The band-pass of the pre-amplifier is adjusted for the longest and shortest run lengths of the code sent, a buffer circuit 26 is connected to the output of the pre-amplifier and is used to convert the DC voltage swing of the pre-amplifier to that of an AC current swing. A plurality of gain cells 28A-D are connected in cascade at the output of the buffer circuit.

Each of the gain cells, which preferably are implemented as described in copending application Ser. No. 07/512,304, now U.S. Pat. No. 5,039,952 entitled "Electronic Gain Cell", assigned to the same assignee as the present invention, and hereby incorporated by reference, can comprise first and second common emitter differential transistors, a current source coupled to the emitters of the transistors, and a first plurality of forward biased series diodes connected between the power supply terminal and a base of the second transistor. A collector of the first transistor of the first gain cell is coupled to the base of the first transistor of the second gain cell, and a collector of the second transistor of the first gain cell is coupled to the base of the second transistor of the second gain cell. Because of the low inherent resistance of the biasing diodes, the operating speed of the amplifier is high, and the current amplification can be large without exceeding the power supply voltage. The current source limits the gain for high level signals without causing saturation of the transistors and therefore, without compromising operating speed. The inherent resistance of each diode and the inherent resistance of the base and the emitter layers of each transistor is the same as the others so that the gain of each cell equals the number of diodes connected to the base of the transistor. A driver circuit 30 is connected at the output of the gain cell 28D. A level restore circuit 32 is connected between the driver and the pre-amplifier. A single ended level restore circuit removes DC offsets present in the amplifier stages to remove any imbalances in the amplifier output.

Figure 2:
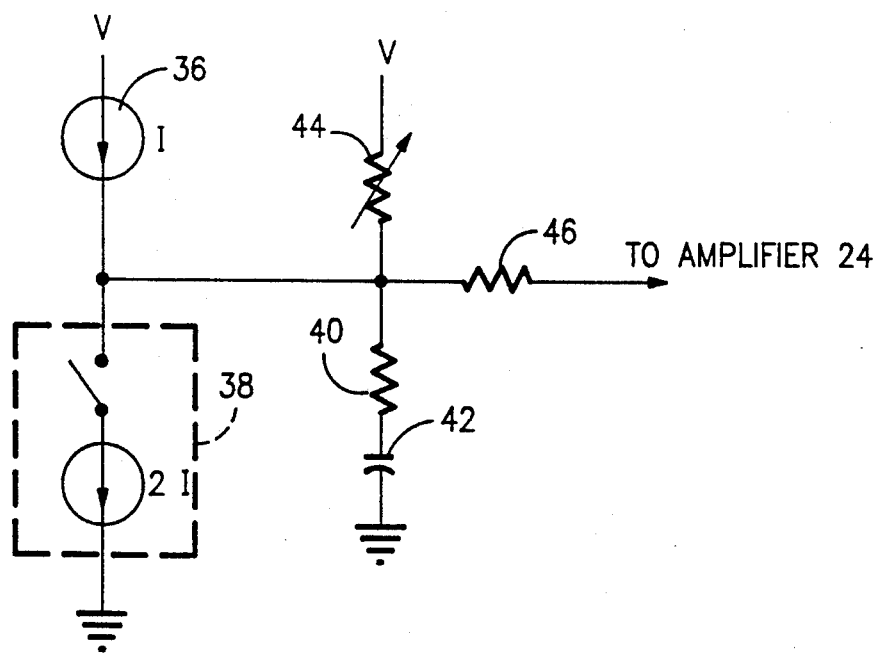
FIG. 2 is a high level schematic diagram of the level restore circuit of FIG. 1 in accordance with the present invention.

Referring now to FIG. 2, a high level schematic diagram of the level restore circuit of FIG. 1 is shown. A current source 36 providing a current of I is in series with a switchable current sink 38, which sinks a current of 2I and is connected to ground. The switchable current source is turned on and off by the digitized output of driver 30 of FIG. 1 which represents the high light level and low light level of light at PIN diode 12. The switchable current source operates when the logic level at the output of the driver is low and does not operate when the logic level at the output of the amplifier is high.

Equation (1) below shows the signal provided at the junction of the current source and the switchable current sink when the width of the high and low pulses are equal, where time 1 is the time the output signal of the driver is high and time 2 is the time the driver is in the low state. During time 1 the switchable current sink is open and during time 2 the switchable current sink is connected and sinking current from the junction of the current sink and current source.

$$I(time\ 1) = (2I - I) \times (time\ 2) \tag{1}$$

Connected in parallel with the switchable current sink is a series connected stability resistor 40 and an integration capacitor 42. The stability resistor is provided to avoid instability in the feedback loop which can cause amplifier oscillations. One end of a variable resistor 44 is connected to the junction of the current source and the switchable current sink, and the other end is connected to a voltage source. Connected between the variable resistor and the stability resistor is an isolation resistor 46, through which the output of the level restore circuit is provided to the inverting input of the pre-amplifier 24. The signal from the junction of the current source and the switchable current sink is fed through the stability resistor 40 to the integrating capacitor 42 which filters the signal and provides a close to DC voltage across the capacitor from the current-time product ratio of input/output currents that occur at time 1 and at time 2. Equation 2 below shows the current time balance during steady state and equation 4 shows the current time product ratio.

$$Isource \times Ton = (Isink - Isource) \times Toff \tag{2}$$

Isource is the current supplied by the current source and Isink is the current supplied by the switchable current sink. Ton is the time the digital output of the amplifier is in the high state and the switchable current source is open. Toff is the time the digital output of the amplifier is in the low state and the switchable current source is switching current.

$$Define\ Pratio = Isource/Isink \tag{3}$$

then $$Ton = (1/Pratio - 1) \times Toff \tag{4}$$

The DC voltage is fed back to the input of the amplifier 24 through resistors 40 and 46 to adjust the pulse widths of the high and low pulses to be equal. For example, if the integration process produces a DC voltage on the integration capacitor that is too low (narrow high level pulses relative to the width of the low level logic pulses caused by offsets in the amplifier) the feedback to the inverting input of the amplifier 24 will correct the width of the high logic level pulses making them wider and making the low level logic pulses narrower. This continues to happen until the integration process is satisfied. This occurs when the current time product produced by the data stream produces a DC voltage on the integration capacitor that when fed back to the amplifier produces a balanced output. Since the current source and switchable current sink are constructed of non-perfect elements, variable resistor 44 is provided which can be adjusted by laser trimming, for example, to remove initial errors in the level restore circuit, such as the switchable current source current not precisely equalling twice the current source current, which could reduce the effectiveness of the feedback circuit. The voltage supplied to the variable resistor 44 can be zero volts or have a negative voltage if necessary.

Figure 3:
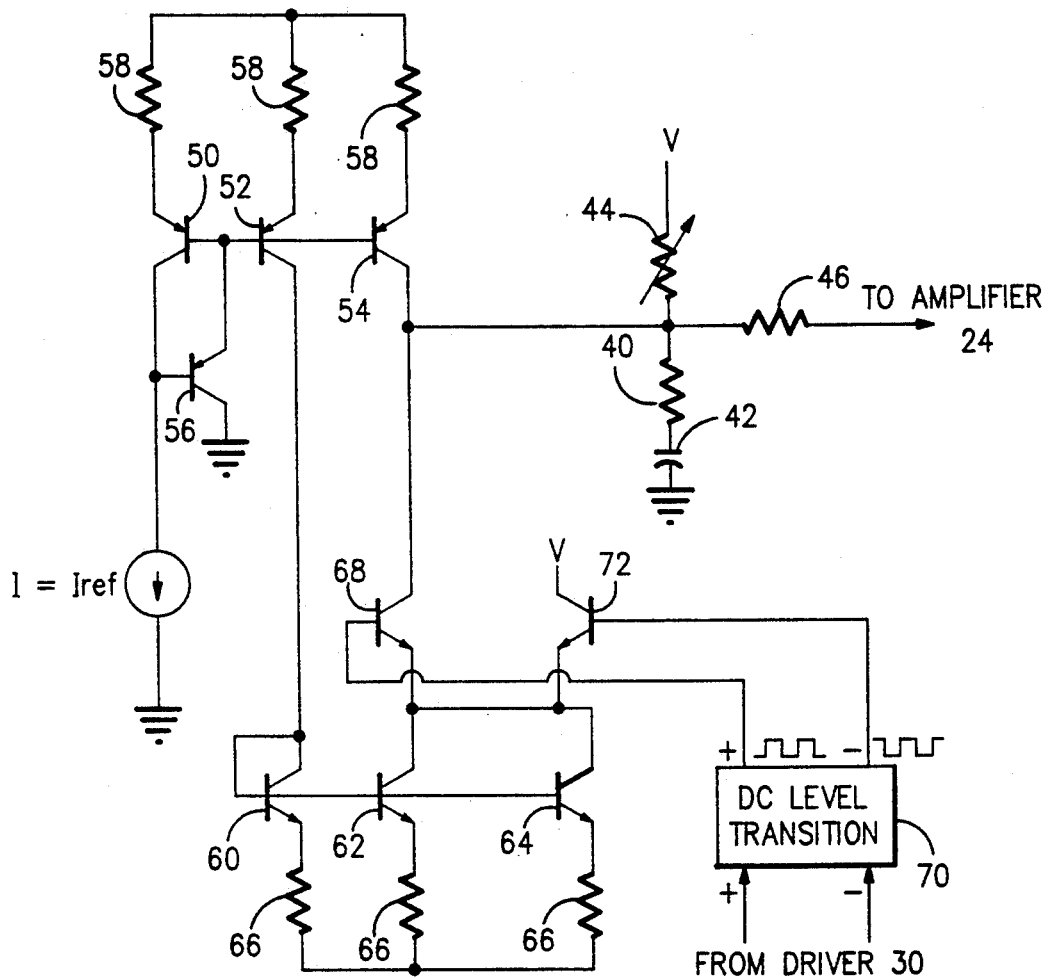
FIG. 3 is a partial schematic, partial block diagram implementation of the level restore circuit of FIG. 2.

FIG. 3 shows a transistor and resistor implementation of the level restore circuit of FIG. 2. A current mirror for sourcing currents to two loads comprises pnp transistors 50, 52, 54, and 56 with transistors 50, 52, and 54 being matched. Transistor 50 has a predetermined current Iref sunk from its collector resulting in an appropriate Vbe for transistor 50. Transistors 52 and 54 are connected in parallel with transistor 50 with the same value emitter resistors 58 and their bases tied together. The emitter resistors 58 are connected to the same power supply. Transistor 56 has its base connected to the collector of transistor 50 and its emitter connected to the bases of transistors 50, 52, and 54 to supply adequate base current. The collector of transistor 56 is connected to ground. The current from the collector of transistor 52 is supplied to a current sink for sinking two currents comprising npn transistors 60, 62, and 64. Transistors 60, 62, and 64 are matched transistors. Transistor 60 has current I supplied to its collector resulting in an appropriate Vbe for transistor 60. Transistor 62 and 64 are connected in parallel with transistor 60 so that they have the same value of Vbe and therefore sink the same current. Emitter resistors 66 are equal and connected to ground. The bases of transistors 60, 62, and 64 are connected together. The base of transistor 60 is connected to the collector of transistor 60 to provide base current. The collector of transistor 54 is connected to the collector of transistor 62 through a npn transistor 68. The positive output of the driver 30, after a DC level transition in block 70 which can be accomplished by diode drops and resistors, is connected to the base of transistor 68. The negative output of the amplifier, which is 180 degrees out of phase with the positive output of the amplifier also undergoes a DC level transition in block 70 and is connected to the base of an npn transistor 72. The collector and emitter of transistor 72 are connected between a power supply and the collector of transistor 64, respectively. The junction of the collectors of transistors 54 and 68 is connected through stability resistor 40 through integrating capacitor 42 to ground. The junction of the collectors of transistors 54 and 68 is also connected through variable resistor 44 to a power source. The junction of the collectors is connected through isolation resistor 46 to the inverting input of the amplifier 24.

In operation, a balanced coding scheme is used in transmitting information to the receiver 10. In a balanced coding scheme the number of the high and low pulses are equal over a predetermined number of transferred bits. For example, in the eight to ten substitution type encoding scheme, a 50% duty cycle is achieved every 20 bits. The output of the driver 20 is a digitized output corresponding to the digital information transmitted to the receiver. This information is provided to a clock restoration circuit which controls a latch (not shown) to sample the output of the driver. The clock restoration circuit relies on the fact that the width of the high and low digital pulses will be equal. When the pulses are not of equal length, the bit error rate in sampling the data increases limiting the data transmission rates and distances that can be achieved.

Current pulses from the junction of the two collectors of transistors 54 and 68, which occur when the transistors 68 and 72 are alternatively biased into conduction, are integrated by the integrating capacitor 42. The integrating capacitor filters the current pulses and provides a voltage across the integrating capacitor which is close to a DC value from the current time ratio of input/output currents. Since the current source mirror is implemented with pnp transistors and the current sink mirror is implemented with npn transistors preferably on the same chip, there is a difference in characteristics, such as current gain, between the two types of transistors. The pnp transistors, because of their smaller current gain, provide less current, so that the current that is sunk is more than twice the current that is sourced. This discrepancy, as well as any other circuit variations in the level restore circuit, can be compensated for during an initial calibration by laser trimming resistor 44 which can be located on the substrate portion of the module having the chip containing the level restore circuit 32. An input of balanced alternating high and low pulses can be supplied directly to the pre-amplifier during calibration.

Since the level restore circuit contains active elements, with current sources supplying current to a capacitor, the capacitor acts as an integrator. The DC correction provided by the level restore circuit is nearly perfect because of the large amount of gain at DC operation. If the level restore circuit had only passive elements, the unbalance detected at the output of the amplifier would only be averaged and fed back. If an unbalance remained uncorrected the average would remain unchanged. In the present invention any unbalance results in a constant net current being supplied to or removed from the capacitance, until the unbalance is corrected. The value of the integrating capacitance is chosen to be below the band-pass of the pre-amplifier, in order to tailor the frequency response so that frequencies below the maximum run length of the data are more sharply attenuated than they would be by the band-pass of the pre-amplifier alone. The value of isolation resistor 46 is chosen to provide isolation between the inverting input of preamplifier 24 and the level restore circuit 32 to avoid diverting current supplied by the PIN diode 12 to the level restore circuit.

Figure 4A:
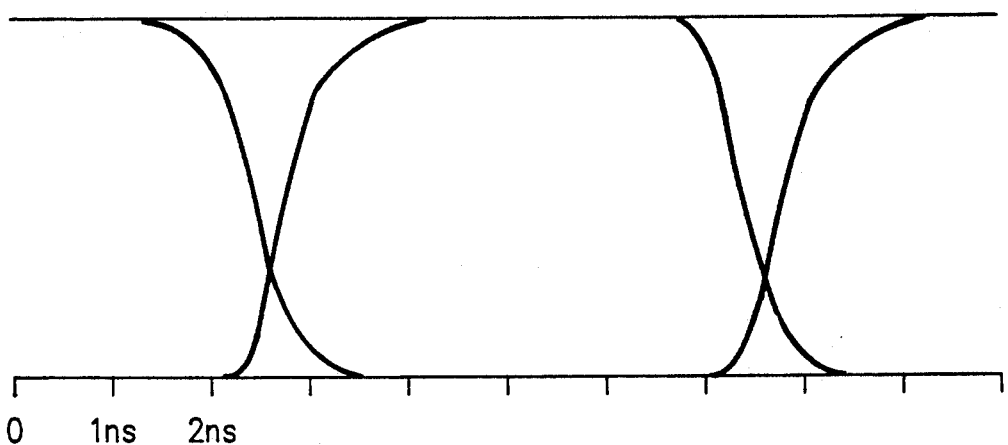
FIG. 4A and 4B are eye diagrams showing digital signals with uncorrected pulse width and corrected pulse width, respectively.
Figure 4B:
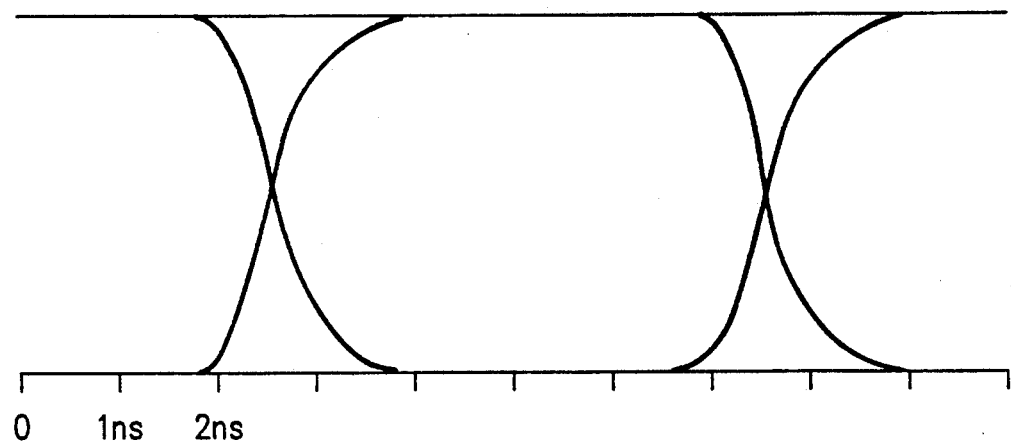

Referring now to FIG. 4A an eye diagram showing crossover distortion in a 200 megabit pattern. FIG. 4B shows a level restored output signal with reduced crossover distortion allowing communication over longer distances without increasing bit error rate penalties.

Use of the active elements feedback circuit with the differential amplifier has reduced distortion to less than plus or minus 2% as determined by equation 5 in system having bit rates of 200 megabits and 1 gigabit.

$$Distortion\ (\%) = ((Ton - Toff)/(Ton + Toff)) \times 100\% \qquad (5)$$

The use of single ended feedback, that is feedback to just one of the differential inputs of amplifier 24, as compared to dual ended feedback, reduces the introduction of intrinsic noise sources that degrade amplifier performance.

The foregoing has described a balanced code communication receiver with high gain feedback to correct amplifier offsets.

While the invention has been particularly shown and described with reference to an embodiment thereof, it will be understood by those skilled in the art that various changes in form and detail may be made without departing from the spirit and scope of the invention.

We claim:

1. A receiver for recovering multibit binary digital messages from transmitted balanced code, comprising:
   a differential amplifier for amplifying received balanced code and supplying high and low digital output signals; and
   an active elements level restore circuit coupled to the digital output of the amplifier, said active elements level restore circuit comprising means for determining a pulse width difference between the high and low digital signals provided by said amplifier and means for integrating the pulse width difference and supplying said integrated pulse width difference to one of said inputs of said differential amplifier, so that a balanced digital output from said amplifier is achieved.

2. The receiver of claim 1, wherein said means for determining the pulse width difference comprises a current source, a switchable current sink in series with said current source, said switchable current sink sinking twice the current provided by said current source, said switchable current sink responsive to the digital output of said amplifier, with said switchable current sink sinking current from said current source only when said digital output is at one of its two logic levels, a signal proportional to the pulse width difference provided at the junction of said current source and switchable current sink.

3. The receiver of claim 2 wherein said means for integrating comprises a capacitor coupled to the junction of said current source and said switchable current sink.

4. The receiver of claim 3 wherein said amplifier has a band-pass characteristic selected to pass the longest high and longest low level run length expected from said balanced code, and said capacitor value selected to reduce the amplifier gain at frequencies below the band-pass frequencies.

5. The receiver of claim 3 wherein said level restore circuit further comprises trim means for balancing said current source and current sink means.

6. The receiver of claim 5 wherein said trim means comprises a variable resistor coupled to a voltage source for supplying or removing current from the junction of said current source and said switchable current sink.

7. The receiver of claim 4 wherein said differential amplifier comprises a differential transimpedance amplifier.

8. A fiber optic receiver for recovering multibit binary digital messages from optically transmitted balanced code comprising:
   a photo-detector circuit for converting the received optical signals into electrical signals;
   a differential amplifier AC coupled to the photo-detector circuit for amplifying the electrical signals and supplying high and low digital output signals; and an active elements level restore circuit coupled to the digital output of the amplifier, said active elements level restore circuit comprising means for determining a pulse width difference between the high and low digital signals provided by said amplifier and means for integrating the pulse width difference and supplying said integrated pulse width difference to one of said inputs of said differential amplifier, so that a balanced digital output from said amplifier is achieved.

9. The receiver of claim 8, wherein said means for determining the pulse width difference comprises a current source, a switchable current sink in series with said current source, said switchable current sink sinking twice the current provided by said current source, said switchable current sink responsive to the digital output of said amplifier, with said switchable current sink sinking current from said current source only when said digital output is at a one of its two logic levels, a signal proportional to the pulse width difference provided at the junction of said current source and switchable current sink.

10. The receiver of claim 9 wherein said means for integrating comprises a capacitor coupled to the junction of said current source and said switchable current sink.

11. The receiver of claim 10 wherein said amplifier has a band-pass characteristic selected to pass the longest high and longest low level run length expected from said balanced code, and said capacitor value selected to reduce the amplifier gain at frequencies below the band-pass frequencies.

12. The receiver of claim 10 wherein said level restore circuit further comprises trim means for balancing said current source and current sink means.

13. The receiver of claim 12 wherein said trim means comprises a variable resistor coupled to a power source for supplying or removing current from the junction of said current source and said switchable current sink.

14. The receiver of claim 10 wherein said differential amplifier comprises a differential transimpedance amplifier.

* * * * *